United States Patent [19]

Marcus

[11] Patent Number: 4,513,064

[45] Date of Patent: Apr. 23, 1985

[54] PACKAGE FOR RUGGED ELECTRONICS

[75] Inventor: Ira R. Marcus, Rockville, Md.

[73] Assignee: The United States of America as represented by the Secretary of the Army, Washington, D.C.

[21] Appl. No.: 450,617

[22] Filed: Dec. 17, 1982

[51] Int. Cl.$^3$ .......................... H01K 7/18; H01R 9/09
[52] U.S. Cl. .................................. 428/582; 428/598; 361/412; 339/17 N
[58] Field of Search ............... 339/17 A, 17 M, 17 N; 211/189; 52/284; 46/30; 361/412; 428/598, 582, 578, 583, 901

[56] References Cited

U.S. PATENT DOCUMENTS

| | | | |
|---|---|---|---|
| 2,279,864 | 4/1942 | Eide | 211/189 |
| 2,786,969 | 3/1957 | Blitz | 339/17 N |
| 2,816,253 | 12/1957 | Blitz | 339/17 N |
| 2,850,681 | 9/1958 | Horton | 339/17 N |
| 2,995,686 | 8/1961 | Selvin | 339/17 N |
| 3,066,436 | 12/1962 | Schuh | 46/30 |
| 3,087,096 | 4/1963 | Jorgensen | 339/17 N |
| 3,379,315 | 4/1968 | Broadwin | 211/189 |
| 3,522,485 | 8/1970 | De Metrick | 339/17 N |
| 3,614,541 | 10/1971 | Farrand | 361/412 |
| 3,833,840 | 9/1974 | Sinden | 361/394 |
| 3,855,748 | 12/1974 | Thomas | 46/30 |
| 4,085,433 | 4/1978 | Baranowski | 361/396 |
| 4,216,523 | 8/1980 | Harford | 361/409 |
| 4,228,483 | 10/1980 | Haury et al. | 361/393 |
| 4,283,755 | 8/1981 | Tracy | 361/393 |

FOREIGN PATENT DOCUMENTS

| | | | |
|---|---|---|---|
| 62389 | 5/1981 | Japan | 339/17 A |
| 938327 | 10/1963 | United Kingdom | 361/412 |
| 1446913 | 8/1976 | United Kingdom | 361/412 |

OTHER PUBLICATIONS

Electronic Design, Nov. 9, 1960, p. 90, Fig. 39.
Electronics, Nov. 25, 1960, p. 93, Fig. 3.
Electronic Design, "Multi-layer Printed Circuits Take Any Geometric Shape", Dec. 6, 1961, p. 59, article 259.
Electron-Technology, Jan. 1962, "Multi-layer Printed Circuit", p. 130.

*Primary Examiner*—L. Dewayne Rutledge
*Assistant Examiner*—John J. Zimmerman
*Attorney, Agent, or Firm*—Anthony T. Lane; Robert P. Gibson; Saul Elbaum

[57] ABSTRACT

A substrate which serves as an element for building an electronic module for ordnance applications comprising a body portion, for receiving electronic components, and a plurality of tab means extending therefrom for interlocking with complementary tab means on another similar substrate. The tab means may extend from the top, bottom, and/or sides of the substrate, and serve to mechanically and electrically interconnect with complementary tab means or apertures on adjacent substrates to form an electronic module of high mechanical strength and reliability. Such an electronic module may be assembled from at least three substrates. Each substrate has at least two tab means on each side edge thereof.

6 Claims, 13 Drawing Figures

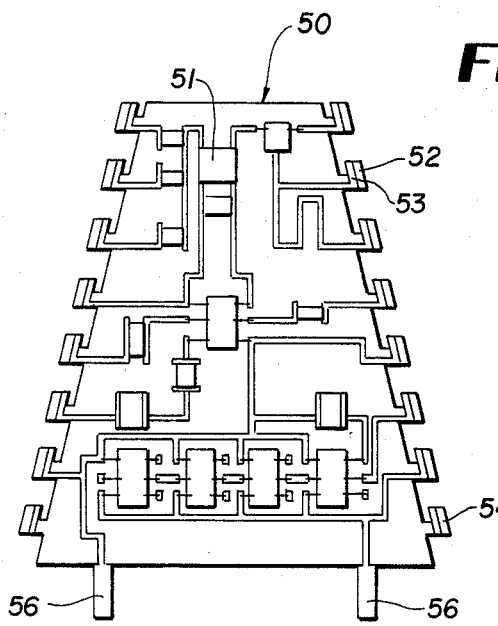
FIG.5
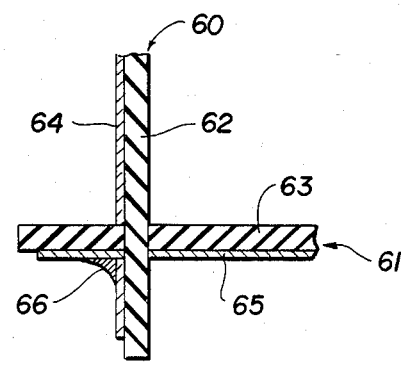
FIG.6a
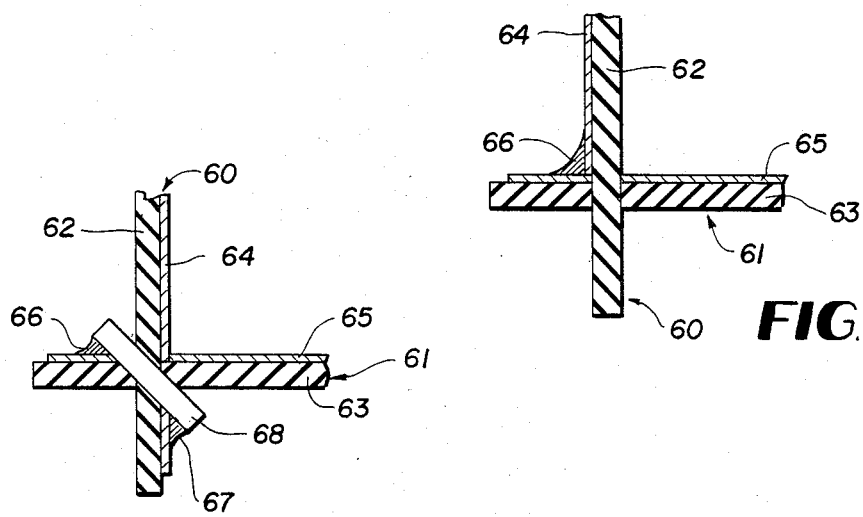
FIG.6b
FIG.6c
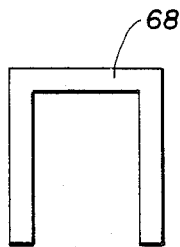
FIG.6d

PACKAGE FOR RUGGED ELECTRONICS

STATEMENT OF GOVERNMENT INTEREST

The invention described herein may be manufactured and used by or for the government for governmental purposes without the payment of any royalty thereon.

BACKGROUND OF THE INVENTION

This invention relates generally to low cost electronic packaging for use in rugged environments and more particularly to military ordnance applications.

Substrates upon which electronic components are mounted and electrically connected have been known and used for some time. It is often useful to connect two or more substrates to form a module to perform functions that cannot be performed by one substrate alone.

One application where tow or more interconnected substrates are needed is in ordnance projectiles. Designing interconnected substrates for these projectiles presents unique problems. First, such projectiles undergo rapid acceleration, thereby placing great stress on any interconnection between substrates. Substrates interconnected by use of additional parts, such as pins, wires or connectors may come loose in the rugged environment of an ordnance projectile. Thus, there is a need for substrates which can be formed into an electronic module having high inherent mechanical strength and electrical and mechanical connection reliability. Second, since ordnance projectiles are small, any set of interconnected substrates must be capable of assuming a variety of shapes to conform to the limited space inside any particular projectile. Also, any set of substrates used in a projectile should have a low manufacturing cost and be compatible with existing electronic circuitry fabrication technologies.

It is also desirable to permit access to the volume along the axis of the projectile for such uses as rotary setting mechanisms, fluidic power supplies, or explosive trains. EMI shielding, when necessary to a particular circuit, is likewise an important concern in projectile component design. Thus, an interconnected substrate module should be constructed to accommodate these concerns.

SUMMARY OF THE INVENTION

An object of the present invention is to provide a substrate which may be connected with other similar substrates to form an electronic module of high inherent mechanical strength.

Another object of the present invention is to provide a substrate which, when combined with other similar substrates, will form an electronic module having high electrical and mechanical reliability.

A further object of the present invention is to provide a substrate which may be interconnected with other similar substrates, to produce an electronic module which may be formed into a variety of shapes so as to make economical use of a minimal space and yet is inexpensive to manufacture.

A still further object of the present invention is to provide a substrate which connects to other substrates without the use of additional parts, such as pins, wires or connectors, to produce an electronic module and is compatible with the existing electronic circuitry fabrication technologies.

The foregoing and other objects of the present invention are realized in a planar substrate comprising a body portion and a plurality of tabs extending from the body portion which interlock directly with complementary tabs extending from the body portion of other substrates. These tabs mechanically and electrically connect the substrate with other substrates. Three or more substrates, each with complementary tab means thereon, may be interconnected to form a module of relatively high mechanical strength. Each substrate may also include additional tabs, extending from the top and/or bottom of the body portion, to attach to one or more end caps so as to further increase mechanical strength of the module.

Other objects, advantages, and novel features of the present invention will become apparent from the following detailed description of the invention when considered in conjunction with the accompanying drawings.

BRIEF DESCRIPTION OF THE DRAWINGS

FIG. 5 shows a front view of a substrate embodying the present invention with electronic circuitry and parts.

FIGS. 6a, 6b and 6c show top views of the substrate interconnections of the module shown in FIG. 3.

FIG. 6d shows a front view of the interconnect clip illustrated in FIG. 6c.

DETAILED DESCRIPTION OF THE PREFERRED EMBODIMENTS

Figure 1:
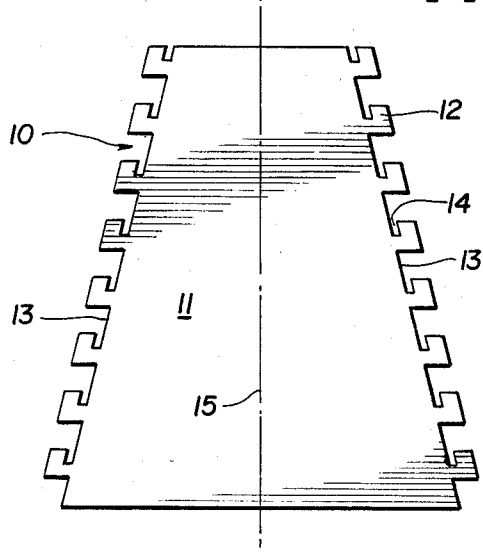
FIG. 1 shows a front view of a substrate having connecting tabs according to the present invention.

FIG. 1, which illustrates a preferred embodiment of the present invention, shows a substrate 10 having a body portion 11 and a plurality of connecting tabs 12 on each side thereof. Although eight sets of such tabs 12 are shown in FIG. 1, the present invention specifically contemplates the use of any number of such sets as long as there are at least two tabs 12 on each side of substrate 10.

Connecting tabs 12 project outwardly from the edges of sides 13 and are provided with connection notches 14 suitable for directly engaging and interlocking complementary tabs of other adjacent substrates. Thus, tabs 12 may form "L", "J", "U", or other suitable shapes depending upon the configuration of the complementary tabs they interlock with.

Figure 2:
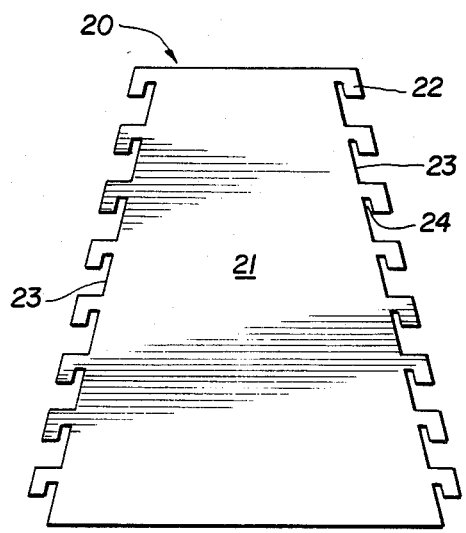
FIG. 2 shows a front view of a substrate having connecting tabs complementary to the connecting tabs of the substrate shown in FIG. 1, according to the present invention.

Tabs 12 are used to mechanically and electrically interconnect substrate 10 with other similar adjacent substrates, such as, for example, substrate 20 shown in FIG. 2. Substrate 20 has a body portion 21 and a plurality of connecting tabs 22 on each side 23 thereof. Tabs 22 have notches 24 therein formed complementarily to notches 14 on tabs 12, thus permitting tabs 22 to interlock with tabs 12 to interconnect substrates 10 and 20.

Figure 3:
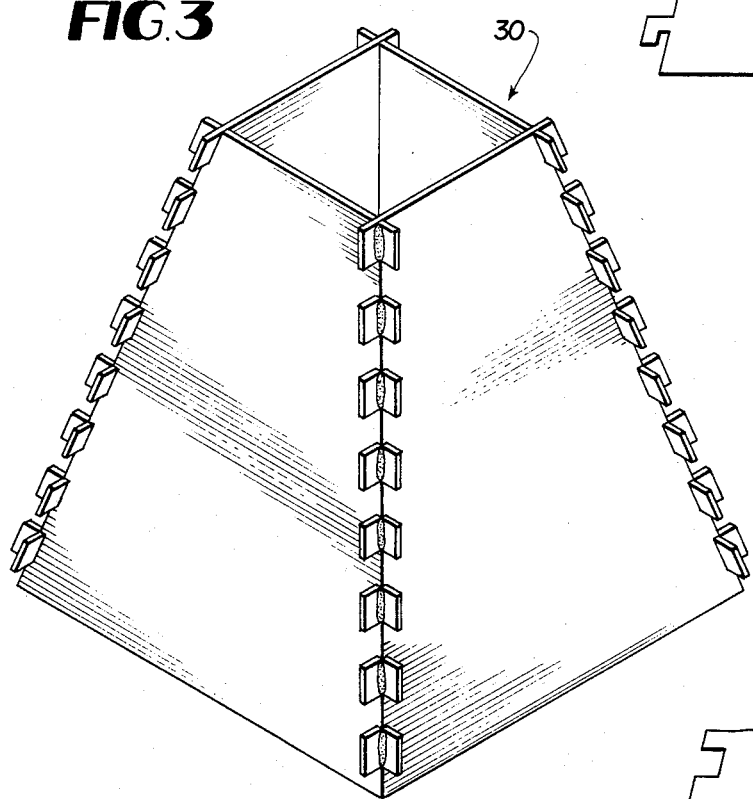
FIG. 3 illustrates a perspective view of a module assembled from substrates that are electrically and mechanically interconnected through tabs according to the present invention.

FIG. 3 shows a preferred embodiment of a hollow electronic module 30 assembled from four substrates, such as those shown in FIGS. 1 and 2, which are electrically and mechanically interconnected by means of their respective tabs. Because the tabs on one substrate interlock with the tabs on each of the two adjacent substrates, resulting module 30 has high mechanical strength and will withstand the sudden acceleration of an ordnance projectile.

Substrates such as 10 may be advantageously symmetrical about longitudinal axis 15, running through the center of substrate 10 equidistant from each side 13, so that the right side of substrate 10 is a mirror image of the left side of substrate 10, but this is not an essential feature of the present invention. Substrate 10 may also be advantageously flat and planar, although this also is not an essential feature of the present invention. To the extent that the configuration of substrate 10 is simplified, manufacturing costs may be lower.

Substrates such as 10 and 20 may be fabricated from a variety of standard insulating materials commonly used in the electronics field, such as printed circuit board material or metal core-surface insulated material, like porcelainized steel, for example. The substrate may be designed as a flat, planar element to allow for ease of electronic component mounting and printing or depositing of electronic component interconnecting conducting patterns on the substrate body portion. Also, planar substrate elements may be more easily formed into spacially economic modules so as to fit within projectiles.

Figure 4A:
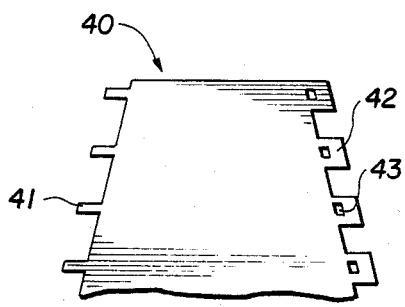
FIGS. 4a and 4b illustrate front views of two further embodiments of the present invention showing different possible tab structure designs.
Figure 4B:
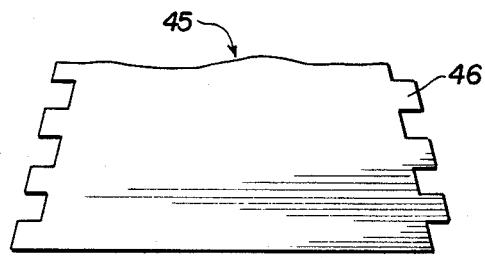

The present invention is not limited to the use of any one particular type of tab design. For example, FIGS. 4a and 4b show two alternative connecting tab designs according to the present invention. Substrate 40 in FIG. 4a shows tabs 41, which are rectangular extensions from one side edge of substrate 40, and tabs 42, which extend from the other side edge of substrate 40, and are in the shape of rectangles having apertures 43 therein. The configurations of apertures 43 correspond to the cross-sectional configurations of tabs 41. Substrate interconnection is achieved by insertion of tabs 41 into apertures 43. In FIG. 4b, substrate 45 has tabs 46, which are in the shape of thick rectangular projections, identically shaped on either side of the substrate, the spaced such that the projections on the left side are linearly offset from the projections on the right side of the substrate. Thus, interconnection of the adjacent substrates is achieved by insertion of their respective tabs between one another. The present invention contemplates the use of various different tab designs on the same substrate, thus tabs 41 and complementary tabs 42 may be employed in conjunction with tabs 46 and their complementary tabs on the same substrate to interconnect adjacent similar substrates and form an electronic module.

FIG. 5 shows substrate 50 having electronic circuitry 51 on one side thereof. Circuitry 51 may form, for example, resistors, capacitors, transistors or integrated circuits dies, and conductor paths therebetween. Substrate 50 also includes a plurality of connecting tabs 52 having conductor paths 53 thereon which serve as means for direct electrical interconnection with other substrates.

In addition, substrate 50 includes connecting tabs 54 which mechanically interconnect that substrate directly to other adjacent substrates. In environments or usages wherein the substrate module would be subjected to very high mechanical stress, a preferred embodiment of the present invention employs tabs 54 such that they receive almost all of the mechanical stress while tabs 52 receive a minimum of mechanical stress so that tabs 52 may provide a more reliable electrical connection. This may be achieved, for example, by having tabs 54 interlock along a surface plane perpendicular to the direction of primary stress while tabs 52 interlock along a surface plane parallel to the direction of primary stress.

FIGS. 6a, b and c show various methods, according to the present invention, of electrically connecting the tabs described in FIGS. 1 and 2 (wherein identical numbers represent identical parts). Securing of these electrical connections may be done by soldering, welding, or any other suitable means. FIG. 6a shows two mechanically interconnected substrates 60 and 61 having interlocked tabs 62 and 63 with conductor path traces 64 and 65 on the outside surfaces thereof. Contact between these two conducting traces at the point of mechanical interconnection provides electrical interconnection between the adjacent substrates. Solder fillet 66 is placed between traces 64 and 65 so that outside trace 64 of substrate 60 is soldered to outside trace 65 of substrate 61 and the electrical connection is thereby secured.

FIG. 6b shows two substrates 60 and 61 connected by their respective tabs 62 and 63; however, in this embodiment, trace 65 is on the inside surface of substrate 61 and trace 64 is on the outside surface of substrate 60. This connection is again secured by solder fillet 66.

FIG. 6c shows the electrical interconnection of substrates 60 and 61, both having conducting traces on the inside surfaces thereof, secured by solder fillets 66 and 67 and interconnect clip 68.

FIG. 6d shows another view of the interconnect clip 68 used to join the substrates in FIG. 6c.

Figure 7:
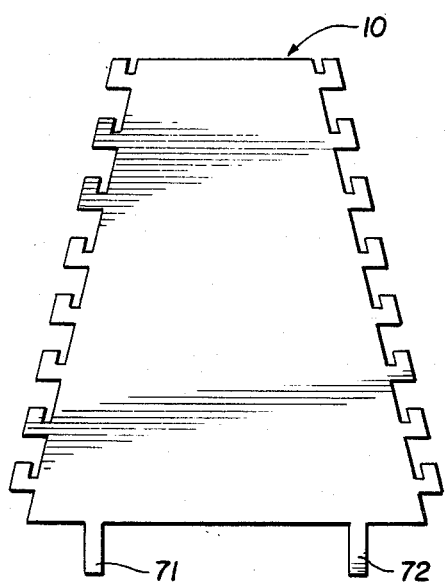
FIG. 7 shows a front view of the substrate of FIG. 1 having bottom end tabs according to a further embodiment of the present invention.

FIG. 7 shows additional bottom connection tabs 71 and 72 on substrate 10 which may be used as mechanical or electrical connection means for functions exterior to the multi-substrate module. FIG. 5 shows another embodiment of this aspect of the present invention wherein conductor paths 56 lead onto tabs 71 and 72. Connection tabs similar to tabs 71 and 72 may also be added to the top of each substrate in the module (not shown in figures). Again, these tabs may be of various configurations.

Figure 8:
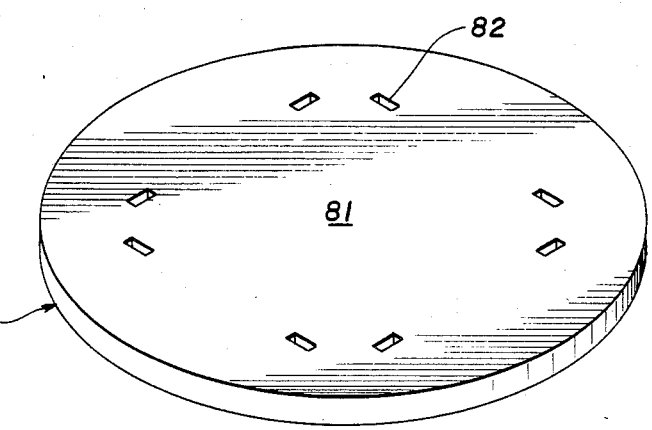
FIG. 8 shows a perspective view of a bottom end cap according to the present invention.
Figure 9:
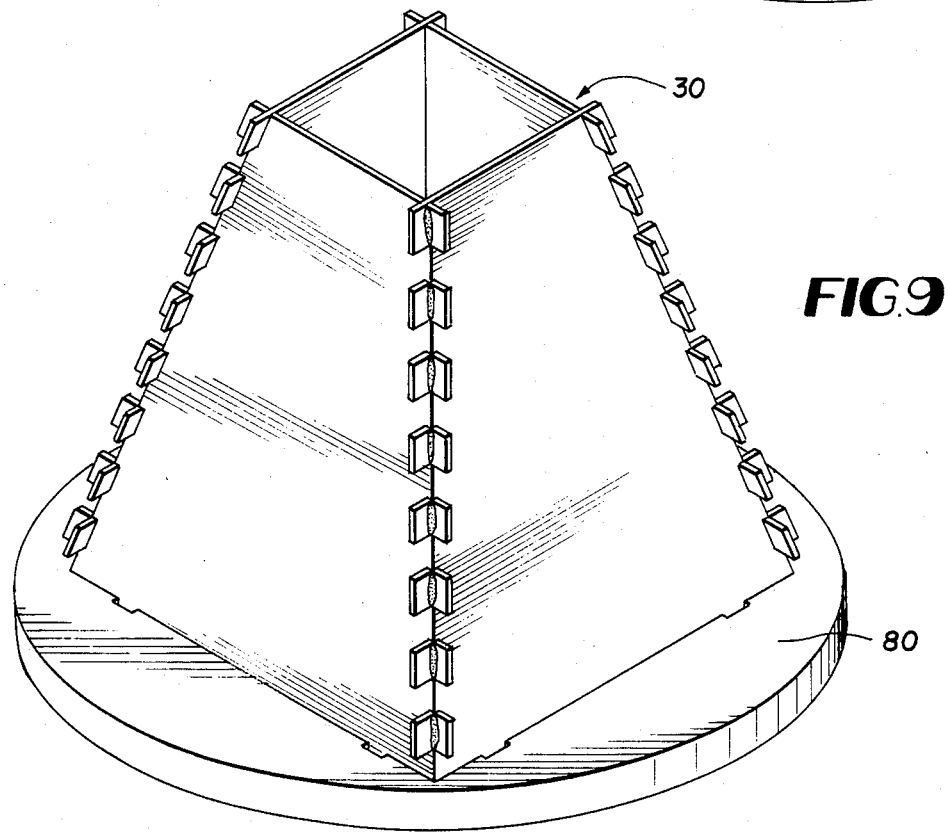
FIG. 9 shows a perspective view of the module shown in FIG. 3 with a bottom end cap attached thereto accoding to the present invention.

FIG. 8 shows a bottom end cap 80 into which the bottom tabs of a 4-substrate module (as shown in FIG. 3) may be inserted to increase the mechanical strength of that module, as shown in FIG. 9. Bottom end cap 80 contains an upper surface 81 and apertures 82 therein for receiving bottom tabs 71 and 72 from substrates 70 of FIG. 7. The configurations of apertures 82 are such that they may interlock with tabs 71 and 72.

Bottom end cap 80 may also act as a bottom seal if the interior of the hollow substrate module is to be encapsulated within plastic. Bottom end cap 80 may be fabricated from the same material used for the substrates. The bottom end cap 80 may also contain electronic components or electrical interconnection traces. Similarly, a top end cap may be advantageously employed to complete the closure of a multi-substrate module if so desired.

Thus, it can be seen that modules built from the substrates embodying the present invention have high mechanical strength because of their interlocking tabs, particularly if the substrates are formed of porcelainized steel. In addition, a module assembled from such substrates is electrically and mechanically reliable because there are no interconnection pins, wires, or connectors which may fall off, and therefore disconnect the module, during moments of such high mechanical stress as is often experienced in projectile. Further, because the substrates and their connecting tabs can be made in a wide variety of configurations, the modules formed therefrom may take on a wide variety of shapes so as to make economical use of the limited space within projectile bodies. Another advantage of the present invention is that by using such substrates to produce a hollow module suitable for insertion into a projectile body along the projectile axis, as is seen in FIG. 9, the volume along that axis is accessible for such uses as rotary setting mechanisms, fluidic power supplies, and explosive trains. In addition, EMI shielding is simplified since the circuitry package or module of the present invention can enclose all the circuitry within its own metal housing if metal-core substrates are used. Finally, a module composed of such interconnected substrates having electronic components on the inside surfaces thereof can form a closed package which protects the electrical parts during shipping, projectile assembly, and use.

From the preceding description of the preferred embodiment, it is evident that the objects of the invention are attained, and although the invention has been described and illustrated in detail, it is clearly understood that the same is by way of illustration and example only, and is not to be taken by way of limitation. The scope and spirit of this invention are to be limited only by the terms of the appended claims.

What is claimed is:

1. An Electronic module for an ordnance projectile for utilization in environments wherein the substrate module would be subject to very high mechanical stress, comprising:

at least three substrates having electronic components thereon, each of said substrates having first and second interconnecting tab means extending therefrom, each of which tab means interlocks with complementary tab means interlocks with complementary tab means extending from the substrate adjacent said tab means to form a module of relatively high mechanical strength in order to withstand high mechanical stress;

wherein each of said substrates is planar and has two sides and top and bottom edges and said first and second tab means are disposed on each side of each substrate, respectively; and each of said substrates are tapered inwardly toward the top such that the bottom edge of the substrate is longer than the top edge;

wherein said interconnecting tab means mechanically and electrically directly interconnect said substrate to the tab means on a similar adjacent substrate;

wherein said electrically interconnecting tabs are soldered to complementary electrically interconnecting tabs on a similar substrate so as to secure the the electrical conduction path across these complementary conducting traces; and wherein said mechanically interconnecting tab means interlock along a surface plane that is perpendicular to the direction of flight of said ordnance projectile wherein said direction of flight is also parallel to the direction in which primary mechanical stress occurs, while the electrically interconnecting tabs interlock along a surface plane that is parallel to said primary mechanical stress such that the mechanically interconnecting tabs receive most of the mechanical stress.

2. A substrate according to claim 1 wherein said substrate is symmetrical about a longitudinal axis that is equidistant from each of said sides and said body portion is planar.

3. A substrate according to claim 1 wherein said substrate is composed of porcelainized steel.

4. The electronic module of claim 1 wherein each of said substrates has at least two sides and each of said first and second tab means is comprised of a plurality of interlocking tabs disposed respectively on one of the sides of each substrate and wherein each tab interlocks with a complementary tab on an adjacent substrate.

5. The electronic module of claim 1 wherein at least one of said substrates includes a third tab means on said top or bottom edges thereof for interconnecting to connection means exterior to said module.

6. The electronic module of claim 5 wherein said exterior connection means comprises a top or bottom end cap containing at least one aperture therein for receiving said third tab means and interconnecting to said module by said third tab means.

* * * * *